United States Patent
Walther et al.

(10) Patent No.: US 6,599,594 B1
(45) Date of Patent: *Jul. 29, 2003

(54) GLASS CONTAINER FOR MEDICINAL PURPOSES

(75) Inventors: Marten Walther, Engelstadt (DE); Andreas Geiger, Woerrstadt (DE); Petra Auchter-Krummel, Vendersheim (DE); Michael Spallek, Ingelheim (DE)

(73) Assignee: Schott Glas, Mainz (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/564,758

(22) Filed: May 4, 2000

(30) Foreign Application Priority Data

May 7, 1999 (DE) .......................... 199 21 303

(51) Int. Cl.⁷ .......................... B65D 23/02; C23C 16/52
(52) U.S. Cl. .................... 428/34.6; 428/34.7; 215/12.2; 215/DIG. 3; 65/60.3; 604/403
(58) Field of Search ................ 428/34.6, 34.7; 65/60.3, 60.8; 215/12.2, DIG. 3; 604/403

(56) References Cited

U.S. PATENT DOCUMENTS

| | | | | |
|---|---|---|---|---|
| 2,504,482 A | | 4/1950 | Goldman ................... 604/403 |
| 3,939,834 A | * | 2/1976 | McMahon .................. 128/272 |
| 5,437,894 A | * | 8/1995 | Ogawa et al. ............... 427/299 |
| 5,521,351 A | * | 5/1996 | Mahoney ................ 118/723 R |
| 5,702,770 A | * | 12/1997 | Martin ....................... 427/475 |
| 5,721,027 A | * | 2/1998 | Frisk et al. ................. 428/34.5 |
| 5,972,436 A | * | 10/1999 | Walther ...................... 427/237 |
| 6,143,417 A | * | 11/2000 | Nomura et al. ........... 428/425.6 |
| 6,180,191 B1 | * | 1/2001 | Felts ........................... 427/237 |
| 6,242,053 B1 | * | 6/2001 | Anderle et al. ............. 427/237 |

FOREIGN PATENT DOCUMENTS

| | | |
|---|---|---|
| DE | 44 38 359 A1 | 5/1996 |
| DE | 44 45 427 A1 | 6/1996 |
| DE | 196 29 877 C | 3/1997 |
| DE | 196 29 877 C1 | 3/1997 |
| DE | 196 22 550 A1 | 12/1997 |
| EP | 0 252 870 A | 1/1988 |
| EP | 0 811 367 A | 12/1997 |
| EP | 0 881 197 A | 12/1998 |
| GB | 2 230 260 A | 10/1990 |
| JP | 5-132065 | 5/1993 |
| JP | 05-132065 A | * 5/1993 |

OTHER PUBLICATIONS

Derwent Abstract Translation of DE 196 29 877 (Derwent Acc No. 1997–181111).*

(List continued on next page.)

*Primary Examiner*—Paul Thibodeau
*Assistant Examiner*—Kevin M Bernatz
(74) *Attorney, Agent, or Firm*—Michael J. Striker

(57) ABSTRACT

The glass container stores and preserves pharmaceutical or diagnostic solutions for medicinal purposes. So that the container is free of silicones and other residues, it is provided with an amorphous, transparent anti-adherent coating (4) over its entire interior surface from its bottom over the wall (3) to the closure device (2). This anti-adherent coating (4) is free of heavy metals, free of silicones, is stable after autoclaving at about 120° C. for about 20 min or hot air sterilization for 30 min at 300° C., has a contact angle for wetting with water of $\geq 80°$, contains silicon, oxygen, carbon, fluorine and hydrogen and is deposited by a PECVD method, especially a PICVD method. If the coating contains less than 0.1% by weight fluorine, then it contains greater than or equal to 10% by weight carbon, but if it contains greater than or equal to 0.1% fluorine then it contains greater than or equal to 5% by weight carbon.

3 Claims, 1 Drawing Sheet

OTHER PUBLICATIONS

Dictionary of Chemistry, 2nd Ed., Penguin Books: London, 1990, pp. 357–359.*

JPO Abstract translation to Tokkyo Kokai JP–05–132065A (Clipped Image No. JP405132065A).*

M. Walther et al: "Multilayer Barrier Coating System Produced By Plasma–Inpulse Chemical Vapor Depoistion (PICVD)" Surface and Coating Technology, NL, Amsterdam, BD. 80, 1996, pp. 200–202, XP 002099295.

Patent Abstract of Japan, C–1275 Nov. 17, 1994, vol. 18/No. 604.

* cited by examiner

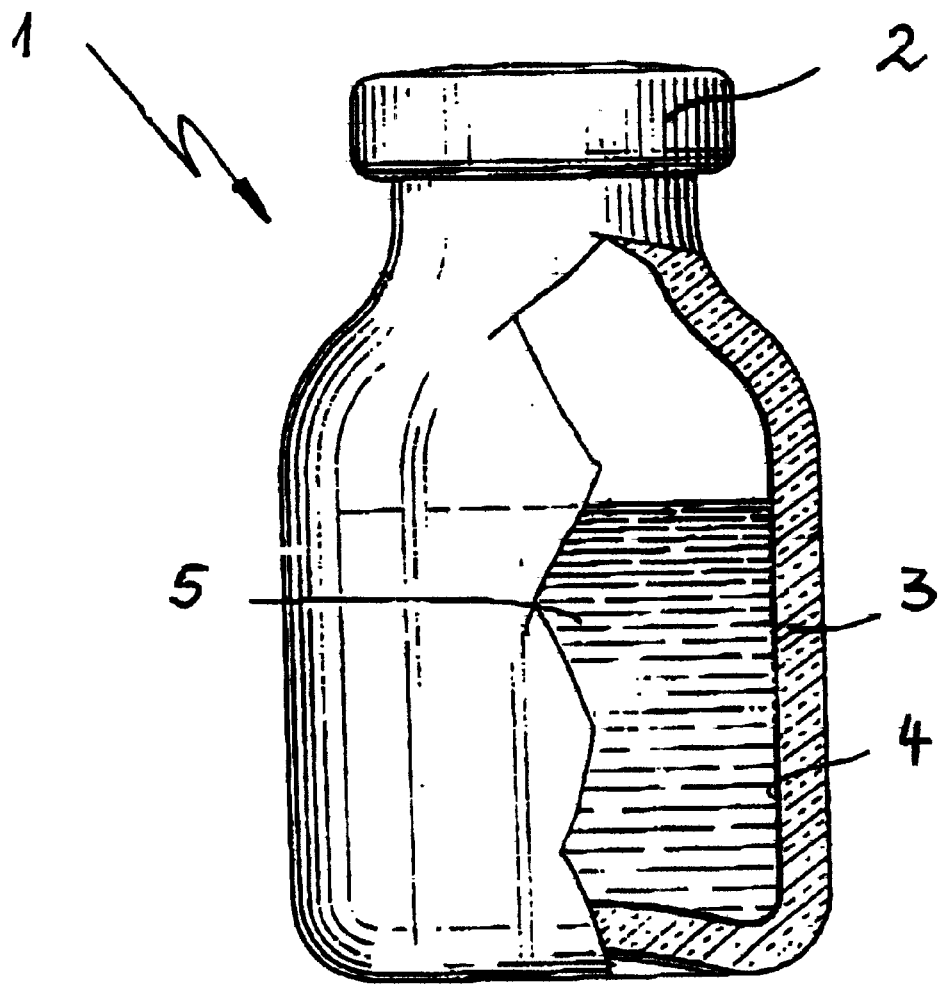

GLASS CONTAINER FOR MEDICINAL PURPOSES

BACKGROUND OF THE INVENTION

1. Field of the Invention

The present invention relates to a glass container for medicinal purposes, and, more particularly, to a glass container for storing and preserving pharmaceutical or diagnostic solutions for medicinal purposes, which is provided with an anti-adherent coating on its interior surface or surfaces.

2. Prior Art

Glass containers for medicinal purposes, i.e. containers having pharmaceuticals or diagnostics as contents, are on the market in a most wide variety of embodiments, in order to take into account their respective purposes, associated administration forms and the respective contents.

Glass containers for medicinal contents should have interior surfaces which have the least possible adherence for their contents, i.e. as large as possible a wetting angle for aqueous contents, in order to permit a complete emptying of residues from the container. This is particularly true for comparatively small glass containers with very expensive contents.

Glass containers for medicinal purposes have been treated with silicone oils (polydimethylsiloxane oil) or silicone oil emulsions, in order to produce anti-adherent interior surfaces. This has been disclosed in U.S. Pat. No. A 2,504,482, among other prior art references. This method is also described in European medical formularies.

The main disadvantage of this method is that silicone oil is dispensed from the surfaces and that the silicone oil may be introduced into human or animal bodies. Furthermore undesirable adsorption phenomena occur on the silicone-coated surface. Protein binding is one of the undesirable adsorption phenomena and is particularly notable. Furthermore heavy metal impurities are unavoidably present in the silicone oil. Thus suitable expensive testing is prescribed In European formularies. Furthermore auxiliary substances (eg. detergents), which must be used for stabilizing silicone emulsions, are critical.

Methods for modification of the interior surfaces of the glass container using silanes, silazanes, etc, are known (GB 2,230,260 A) as well as by application of silicone oil. A monolayer is deposited on the surfaces from the liquid or gas phase after an expensive cleaning process, which often uses reactive acids, such as chromo-sulfuric acid, etc.

This process has the disadvantage that a fresh expensive washing process is required after the surface treatment, in order to remove the residual chemicals most completely. Furthermore no silane or silanized layers, which resist the action of the typical pharmaceutical tests sufficiently, which especially withstand autoclaving at 121° C. for 20 minutes, are currently known.

SUMMARY OF THE INVENTION

It is an object of the present invention to provide a glass container for medicinal purpose of the above-described kind, so that its interior surface has an outstanding anti-adherent property, it is equal to the typical pharmaceutical stress test conditions and it introduces nosilicone into the solution found in the glass container.

According to the invention this object is attained with a glass container for storing and preserving pharmaceutical or diagnostic solutions for medicinal purposes, comprising a container closure device and an amorphous, transparent and pharmaceutically acceptable anti-adherent coating provided on the entire interior surface of the glass container over the entire interior surface up to the closure device, and wherein the anti-adherent coating has a contact angle for wetting with water of $\geq 80°$, even after autoclaving at about 120° C. for about 20 min, contains the elements Si, O, C and H and is deposited by means of a plasma-enhanced chemical vapor deposition method (PECVD), preferably by means of a plasma-pulsed, chemical vapor deposition method (PICVD).

Medicinal glass containers of this type, i.e. according to the invention, have interior surfaces that to a large extent reject water or wetting with water, which permits a nearly complete emptying of the container. It also has the great medically related advantage that no silicone substances are introduced into the pharmaceutical or diagnostic contents and thus into the human body.

Tests have shown that the anti-adherent layer or coating according to the invention is equal to typical pharmaceutical stress test conditions, e.g. typical sterilization conditions, without loosing its function. The glass container according to the invention is thus to a large extent pharmaceutically acceptable.

Preferably the anti-adherent layer comprises at least 1% by weight silicon and at least 5% by weight carbon. The hydrophobic properties of the coating can be augmented, when the anti-adherent coating contains fluorine according to a further embodiment of the invention.

According to a preferred embodiment of the invention the percentage content of fluorine in the anti-adherent layer is related to the percentage content of carbon by the following reciprocal relationship:

When fluorine<0.1% by weight, then $C \geq 10\%$ by weight;
When $F \geq 0.1\%$ by weight, then $C \geq 5\%$ by weight.

BRIEF DESCRIPTION OF THE DRAWING

The objects, features and advantages of the invention will now be illustrated in more detail with the aid of the following description of the preferred embodiment, with reference to the accompanying sole FIGURE which is a partially side, partially cutaway cross-sectional view through a glass container for medicinal purposes according to the invention.

DESCRIPTION OF THE PREFERRED EMBODIMENT

The sole FIGURE shows a glass container 1 for medicinal purposes in a configuration suitable for a typical application, which is provided with a conventional closure device 2. The glass container 1 serves for storage and preservation of a pharmaceutical or diagnostic solution 5.

The glass container 1 is preferably made from a glass type I according to German Dispensatory, 10th Edition, corresponding to a borosilicate glass. The particular glass type mentioned above and the.shape of the glass bottle are features of preferred embodiments. According to the invention the glass bottle may also have other shapes and can be made from other types of glass, which have the required properties for other applications. Especially the glass bottle may be made from glass of a lower hydrolytic class, especially the so-called neutral glass.

It is desirable that the interior of the glass bottle should reject water to a large extent. That means that it should have as large as possible a wetting angle for its aqueous contents 5, especially in order to permit complete emptying so as to minimize any residue left in the bottle. This is also true for a comparatively small glass container with very expensive contents.

In order to achieve this behavior, a special coating 4 is provided over the whole interior surface of the wall 3 of the glass bottle 1. This coating comprises an anti-adherent layer with a contact angle for water of ≧80°, which is pharmaceutically acceptable, i.e. free of heavy metals and stable under the usual test conditions, especially autoclaving for 20 minutes at 121° C. and/or in hot air sterilization for 30 minutes at 300° C. The layer is amorphous, clear and transparent and contains the elements Si, O, C and H, with silicon content of at least 1% by weight and a C content of at least 5% by weight. Preferably the layer 4 also contains fluorine, whose content is in a reciprocal relationship to the carbon content. In other words, when fluorine<0.1% by weight, then C≧10% by weight;
when F≧0.1% by weight, then C≧5% by weight.

The coating or layer 4 is produced by means of a plasma-enhanced chemical vapor deposition process (PECVD). In this process a plasma-assisted layer deposition from the gas phase occurs, in which the layer material is supplied in the form of so-called precursor gases. These pre-cursor gases are broken down with the required energy being supplied to the system by electrical high frequency plasma, particularly in a plasma-pulsed chemical vapor deposition process (PICVD).

These processes and their associated apparatus are well known. Examples are described in DE 196 29 877 C1 and DE 44 38 359 A1, which were produced by the present applicant.

The container for medical purposes according to the present invention has the following properties:

a) its interior surface rejects water, so that its aqueous contents have the greatest possible wetting angle with its interior surface, in order to obtain complete emptying without leaving any residue;
b) its interior surface does not bind proteins;
c) its interior surface is free of silicone (polydimethylsiloxanes);
d) it is stable during typical pharmaceutical stress test conditions and/or terminal sterilization (autoclaving in steam at 121° C. for 20 minutes);
e) it has a high degree of transparency;
f) it has a high stability against washing processes, drying processes, hot air sterilization, filling processes and closing processes, including a washing process with hot distilled water arid a hot air sterilization with temperatures up to 300° C. and dwell times of up to 30 minutes;
g) it provides a high degree of chemical purity, i.e. it is not necessary to use solvents and/or aggressive chemicals for surface activation or cleaning; and it may be produced by a simple method.

It has been surprisingly found that not only the adherence of particles in aqueous suspensions on container interior surfaces is drastically reduced, but also that this is also true for suspensions, which contain an inert propellant gas, such as e.g. R134a, R127. This is also true for alcoholic suspensions.

EXAMPLES

The following two examples which are representative of numerous other tests are described in the following paragraphs. These examples show that the glass container according to the invention has properties that are superior to those of the prior art.

Example 1

Coating According to a PECVD Method

Glass containers in the form of glass bottles are placed in a PFCVD reactor, whose structure corresponds principally to that disclosed in DE 44 38 359 A1. A gas nozzle device extends into the mouth of the bottle. The reactor is evacuated to 0.05 mbar by a pump. Then a mixture of $C_6F_{10}(CF_3)_2$ and 5 sccm of hexamethyldisiloxane (HMDEO) is conducted into the bottle through the gas nozzle device. RF power is coupled to an electrode in the reactor inductively by means of coils through a matching network and Ignites plasma in the reactor. The entire apparatus is arranged within an electrical shielding. In this process the reaction gas is converted into a coating in the whole bottle at about 300 W HF power (13.56 MHz).

A contact angle of 95° to 102° (relative to water) is produced in all bottles by this process. This contact angle becomes 85° to 95° during autoclaving at. 121° C. for 20 minutes. All bottles were filled with an aqueous.suspension. After a storage time of 1 week the pouring behavior was tested. In contrast to the uncoated bottles, in which a residue of flecks of the suspension remained over the entire interior surface after emptying the bottles, the bottles coated in the above-described manner according to the invention, could be completely emptied without leaving a residue.

Example 2

Coating According to a PICVD Method

Glass containers in the form of glass bottles are placed in a PICVD reactor, whose structure corresponds principally to that disclosed in DE 196 29 877 C1. The reactor is evacuated to 0.9 mbar by a pump. In these bottles a gas mixture comprising 10 sccm HMDSO, 5 sccm $O_2$ and 2 sccm $C_6F_6$ is supplied by a supply device. Pulsed power was provided at 2.45 GHz by a microwave discharge source, which ignites a plasma in the glass bottle. After deposition of a 30 nm layer the microwave power is turned off and the bottles are aerated. The tests found that after the coating is formed the contact angle for water was 91° to 105°. This contact angle is reduced about 6° on average after autoclaving. This behavior of a watery suspension that is poured out of bottles coated in this manner is similar to that described in connection with the previous PECVD method.

The disclosure in German Patent Application 199 21 303.8 of May 7, 1999 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a glass container for medicinal purposes, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

We claim:

1. A glass container for storing and preserving pharmaceutical or diagnostic solutions for medicinal purposes, wherein said glass container comprises a closure device (2) and an amorphous, transparent anti-adherent coating (4) provided on an entire interior surface thereof over the entire interior surface up to the closure device;

wherein the anti-adherent coating is free of heavy metals, is free of silicones, is stable after autoclaving at about 120° C. for about 20 min or hot air sterilization for 30 min at 300° C., has a contact angle for wetting by water of $\geq 80°$, even after said autoclaving at about 120° C. for about 20 min, and wherein the anti-adherent coating contains silicon, oxygen, fluorine, carbon and hydrogen and is deposited by means of a plasma-enhanced chemical vapor deposition process;

wherein said coating contains greater than or equal to 10 percent by weight of said carbon when said coating contains less than 0.1 percent by weight of said fluorine, but said coating contains greater than or equal to 5 percent by weight of said carbon when said coating contains greater than or equal to 0.1 percent by weight of said fluorine.

2. The glass container as defined in claim 1, wherein said plasma-enhanced chemical vapor deposition process is a plasma-pulsed chemical vapor deposition process.

3. The glass container as defined in claim 1, wherein said anti-adherent coating (4) contains at least 1% by weight of said silicon.

* * * * *